(12) United States Patent
Okigawa

(10) Patent No.: US 9,070,799 B2
(45) Date of Patent: Jun. 30, 2015

(54) SOLID STATE IMAGING DEVICE WITH MICROLENS SHIFTED FROM THE CENTER OF THE PHOTO DIODE

(71) Applicant: FUJIFILM Corporation, Tokyo (JP)

(72) Inventor: Mitsuru Okigawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 221 days.

(21) Appl. No.: 13/739,659

(22) Filed: Jan. 11, 2013

(65) Prior Publication Data

US 2013/0127002 A1 May 23, 2013

Related U.S. Application Data

(63) Continuation of application No. PCT/JP2011/060716, filed on May 10, 2011.

(30) Foreign Application Priority Data

Jul. 12, 2010 (JP) .................................. 2010-157986

(51) Int. Cl.
*H01L 33/00* (2010.01)
*H04N 5/225* (2006.01)
*H01L 31/0232* (2014.01)
*H01L 27/146* (2006.01)
*H01L 27/148* (2006.01)
*H04N 5/232* (2006.01)
*H04N 5/369* (2011.01)

(52) U.S. Cl.
CPC ...... *H01L 31/0232* (2013.01); *H01L 27/14643* (2013.01); *H01L 27/14621* (2013.01); *H01L 27/14627* (2013.01); *H01L 27/14812* (2013.01); *H04N 5/2254* (2013.01); *H04N 5/23212* (2013.01); *H04N 5/3696* (2013.01)

(58) Field of Classification Search
CPC .................. H01L 27/14687; H01L 27/14621; H01L 27/14627; H01L 21/14812; H01L 31/0232; H01L 27/14643; H04N 5/23212; H04N 5/3696; H04N 5/2254
See application file for complete search history.

(56) References Cited

U.S. PATENT DOCUMENTS

| 6,829,008 | B1 | 12/2004 | Kondo et al. | |
|---|---|---|---|---|
| 7,710,484 | B2 * | 5/2010 | Oda | 348/320 |
| 8,102,460 | B2 * | 1/2012 | Awazu | 348/340 |
| 8,772,892 | B2 * | 7/2014 | Okigawa | 257/432 |
| 2004/0204249 | A1 * | 10/2004 | Grupido | 464/131 |
| 2010/0230583 | A1 * | 9/2010 | Nakata et al. | 250/227.2 |

FOREIGN PATENT DOCUMENTS

| CN | 101080818 A | 11/2007 |
|---|---|---|
| JP | 59-033409 A | 2/1984 |
| JP | 4-267211 A | 9/1992 |
| JP | 2000-156823 A | 6/2000 |
| JP | 2007-158109 A | 6/2007 |
| JP | 2008-071920 A | 3/2008 |
| JP | 2009-176857 A | 8/2009 |

* cited by examiner

*Primary Examiner* — Alonzo Chambliss
(74) *Attorney, Agent, or Firm* — Birch, Stewart, Kolasch & Birch, LLP

(57) ABSTRACT

A CCD image sensor, being a solid state imaging device, has four types of pixels, first to fourth pixels. The first to fourth pixels are arranged in a predetermined pattern. Each of the pixels has a PD and a microlens. Each of the microlens is arranged with its optical axis center eccentric or shifted in a predetermined direction from a center of a light receiving surface of the PD. A part of the microlens overlaps one or more adjacent pixels.

17 Claims, 12 Drawing Sheets

SOLID STATE IMAGING DEVICE WITH MICROLENS SHIFTED FROM THE CENTER OF THE PHOTO DIODE

CROSS REFERENCE TO RELATED APPLICATIONS

This application is a Bypass Continuation of PCT International Application No. PCT/JP2011/060716 filed on May 10, 2011, which claims priority under 35 U.S.C. §119(a) to Patent Application No. 2010-157986 filed in Japan on Jul. 12, 2010, all of which are hereby expressly incorporated by reference into the present application.

BACKGROUND OF THE INVENTION

1. Field of the Invention

The present invention relates to a solid state imaging device capable of automatic focusing of a phase difference method or stereoscopy.

2. Description Related to the Prior Art

A solid state imaging device having a plurality of photodiodes (PDs) which selectively receive light depending on an incident angle and capable of automatic focusing of a phase difference method (hereinafter referred to as the phase difference AF) is known (see Japanese Patent Laid-Open Publication No. 59-033409, U.S. Pat. No. 6,829,008 corresponding to Japanese Patent Laid-Open Publication No. 2000-156823, and Japanese Patent Laid-Open Publication No. 2007-158109).

The solid state imaging device, disclosed in the Japanese Patent Laid-Open Publication No. 59-033409 and the U.S. Pat. No. 6,829,008, has pixels (hereinafter referred to as the phase difference detection pixels) that selectively receive light depending on the incident angle. In each phase difference detection pixel, the optical axis of a microlens that condenses light onto the PD is not coincident with the center of an opening formed through a light shielding film that covers the PD. In this case, an area of the opening needs to be reduced by the amount of eccentricity or shift of the opening of the light shielding film. This makes the sensitivity of the phase difference detection pixel lower than that of the normal pixel with the optical axis of the microlens coincident with the center of the opening of the light shielding film.

The solid state imaging device suggested in the Japanese Patent Laid-Open Publication No. 2007-158109 is provided with a pupil forming microlens that covers two phase difference detection pixels. Two pupil-splitting microlenses corresponding to the respective phase difference detection pixels are provided below the pupil forming microlens that separates light beams. Thereby, the PD of each phase difference detection pixel selectively receives the light beams depending on the incident angle. When the light beams are separated by the pupil forming microlens, and the separated light beams are condensed by the pupil splitting microlenses and incident on the PDs of the phase difference detection pixels, respectively, it is not necessary to reduce the size of the opening of the light shielding film. Thereby, the size of the opening is made the same as that of the normal pixel. This improves the sensitivity of the phase difference detection pixel compared with that of a conventional phase difference detection pixel.

The configuration disclosed in the Japanese Patent Laid-Open Publication No. 2007-158109 improves the sensitivity of the phase difference detection pixels. However, a process for forming the pupil forming microlens is additionally needed, and the thickness of the microlens is increased. Thereby, material for the microlens is increased and the processing of the microlens becomes difficult. As a result, cost for the solid state imaging device increases. In addition to the configuration described above, a configuration in which the optical axis of the microlens is shifted from the center of the light receiving surface of the PD is known. In this configuration, the diameter of the microlens needs to be reduced by the amount of eccentricity or shift. This reduces the sensitivity of the phase difference detection pixels similar to the case with the eccentric or shifted openings of the light shielding film. Thus, it is desired to improve the sensitivity of the phase difference detection pixels in the solid state imaging device employing the phase difference AF with no cost increase.

SUMMARY OF INVENTION

An object of the present invention is to improve the sensitivity of the phase difference detection pixels with no cost increase.

In order to achieve the above object, the solid state imaging device of the present invention has a plurality of phase difference detection pixels arranged adjacent to each other. The phase difference detection pixel includes a photoelectric converter and a microlens. The photoelectric converter photoelectrically converts incident light into charge and accumulates the charge. The microlens is provided to the each photoelectric converter. An optical axis of the microlens is eccentric to a center of the photoelectric converter such that a part of the microlens overlaps the adjacent phase difference detection pixel. The microlens condenses the light onto the photoelectric converter.

It is preferable that the phase difference detection pixels include first pixel with the microlens arranged eccentrically in a predetermined eccentricity direction, a second pixel with the microlens arranged eccentrically opposite to the eccentricity direction, a third pixel with the microlens arranged eccentrically in an orthogonal direction substantially orthogonal to the eccentricity direction, and a fourth pixel with the microlens arranged eccentrically opposite to the orthogonal direction.

It is preferable that the solid state imaging device further includes first pixel rows and second pixel rows. Each of the first pixel rows has the first pixels and the second pixels arranged alternately in a predetermined direction. Each of the second pixel rows has the third pixels and the fourth pixels arranged alternately in the same direction as the predetermined direction. The first and second pixel rows are arranged alternately in a direction substantially orthogonal to the first and second pixel rows. The microlens of each of the third and fourth pixels is arranged eccentrically so as to overlap a part of the adjacent first pixel and a part of the adjacent second pixel. The microlens of each of the first and second pixels is arranged eccentrically so as to overlap a part of the adjacent third pixel and a part of the adjacent fourth pixel.

It is preferable that the phase difference detection pixels are arranged in horizontal and vertical directions in a honeycomb pattern in which the phase difference detection pixels adjacent in the horizontal direction are shifted from each other by ½ pitch in the vertical direction. The pixels in the each pixel row are arranged in an up-down direction of the imaging surface. The microlens of the first pixel is arranged eccentrically in a rightward direction of the imaging surface. The microlens of the second pixel is arranged eccentrically in a leftward direction of the imaging surface. The microlens of the third pixel is arranged eccentrically in an upward direction of the imaging surface. The microlens of the fourth pixel is arranged eccentrically in a downward direction of the imaging surface.

It is preferable that the phase difference detection pixels are arranged in a simple square lattice pattern in horizontal and vertical directions. The pixels in the each pixel row are arranged in a 45-degree oblique direction of the imaging surface. The microlens of the first pixel is arranged eccentrically in an obliquely lower right direction of the imaging surface. The microlens of the second pixel is arranged eccentrically in an obliquely upper left direction of the imaging surface. The microlens of the third pixel is arranged eccentrically in an obliquely upper right direction of the imaging surface. The microlens of the fourth pixel is arranged eccentrically in an obliquely lower left direction of the imaging surface.

It is preferable that an amount of eccentricity of the microlens of the phase difference detection pixel is approximately $(4-\sqrt{10})/3$ times a radius of a maximum circle of the phase difference detection pixel. The maximum circle has a center point, being a center of a light receiving surface of the photoelectric converter.

It is preferable that the solid state imaging device further includes green color filters, red color filters, and blue color filters. The green color filters are provided to the first and second pixels such that all of the pixels in the first pixel row are green phase difference detection pixels. The red color filters and blue color filters are provided to the third and fourth pixels such that, in the second pixel rows, the second pixel row having only red phase difference detection pixels and the second pixel row having only the green phase difference detection pixels are arranged alternately.

It is preferable that the solid state imaging device further includes a charge transfer section for transferring the charge, accumulated in the each photoelectric converter, in a direction substantially parallel with an arrangement direction of the pixels in the each pixel row.

It is preferable that the phase difference detection pixels include first pixels and second pixels. The microlens of the each first pixel is arranged eccentrically in a predetermined eccentricity direction. The microlens of the each second pixel is arranged eccentrically opposite to the eccentricity direction. The solid state imaging device comprises first pixel rows each having the first pixels arranged in the eccentricity direction and second pixel rows each having the second pixels arranged in the eccentricity direction. The first and second pixel rows are arranged alternately in a direction orthogonal to the eccentricity direction. A part of the microlens of the first pixel overlaps a part of the adjacent first pixel. A part of the microlens of the second pixel overlaps a part of the adjacent second pixel.

It is preferable that the solid state imaging device further includes four green color filters, two red color filters, and two blue color filters. The four green color filters are provided to the four pixels arranged next to each other in a direction orthogonal to the pixel rows. The two adjacent red color filters and two adjacent blue color filters are provided to the another four pixels arranged adjacent to and parallel with the four pixels with the green color filters. The green, red, and blue color filters are arranged in units of eight color filters over the pixels. Each unit is composed of the four green color filters, the two red color filters, and the two blue color filters.

It is preferable that the solid state imaging device further includes a plurality of third pixels and a third pixel row composed of the third pixels. In each of the third pixels, the optical axis center of the microlens is coincident with a center of a light receiving surface of the photoelectric converter. Each of the third pixel rows has the third pixels arranged along the first and second pixel rows. The first to third pixel rows are arranged sequentially and repeatedly.

In this case, it is preferable that the solid state imaging device further includes two green color filters, a red color filter, and a blue color filter. The two green color filters are provided to the two pixels arranged obliquely out of the four pixels arranged in a lattice pattern of 2×2. The red color filter and a blue color filter are provided to the two respective remaining pixels. The green, red, and blue color filters are arranged into a Bayer pattern.

It is preferable that the phase difference detection pixels include first pixels and second pixels. The microlens of the each first pixel is arranged eccentrically in a predetermined direction. The microlens of the each second pixel is arranged eccentrically opposite to the eccentricity direction. The solid state imaging device comprises first pixel rows and second pixel rows. Each of the first pixel row has the first pixels arranged in the eccentricity direction. Each of the second pixel rows has the second pixels arranged in the eccentricity direction. The two first pixel rows and the two second pixel rows are arranged in this order repeatedly in a direction substantially orthogonal to the eccentricity direction. A part of the microlens of the first pixel overlaps a part of the adjacent first pixel. A part of the microlens of the second pixel overlaps a part of the adjacent second pixel.

In this case, it is preferable that the solid state imaging device further includes two green color filters, a red color filter, and a blue color filter. The two green color filters are provided to the two pixels arranged obliquely out of the four pixels arranged in a lattice pattern of 2×2. The red color filter and a blue color filter are provided to the two respective remaining pixels. The green, red, and blue color filters are arranged into a Bayer pattern.

It is preferable that the microlens is elongated in a direction substantially orthogonal to the eccentricity direction such that a part of the microlens overlaps the pixel adjacent in the direction substantially orthogonal to the eccentricity direction.

It is preferable that $\delta$ is approximately D/3, where $\delta$ denotes an amount of eccentricity of the microlens of the phase difference detection pixel and D denotes an arrangement pitch of the phase difference detection pixels in a direction parallel with the eccentricity direction of the microlens.

It is preferable that the microlens has one of a hemispherical shape, a semi-ellipsoidal shape, a polyhedral shape, and a polyhedral shape with rounded vertices and lines.

It is preferable that a part of the microlens overlaps the adjacent phase difference detection pixel, and the microlens comes in contact with the microlens of the adjacent phase difference detection pixel.

According to the present invention, each photoelectric converter is provided with one microlens, and a part of the microlens overlaps the adjacent phase difference detection pixel. Thereby, an area of the microlens of the phase difference detection pixel is larger than or substantially equal to that of the microlens of the normal pixel in which the optical axis center of the microlens is coincident with the center of the light receiving surface of the photoelectric converter. This improves the sensitivity of the phase difference detection pixel. There is no need to additionally provide a pupil forming microlens. Thus, there is no cost increase.

BRIEF DESCRIPTION OF DRAWINGS

The above and other objects and advantages of the present invention will be more apparent from the following detailed description of the preferred embodiments when read in connection with the accompanied drawings, wherein like reference numerals designate like or corresponding parts throughout the several views, and wherein.

DESCRIPTION OF THE PREFERRED EMBODIMENTS (First Embodiment)

Figure 1:
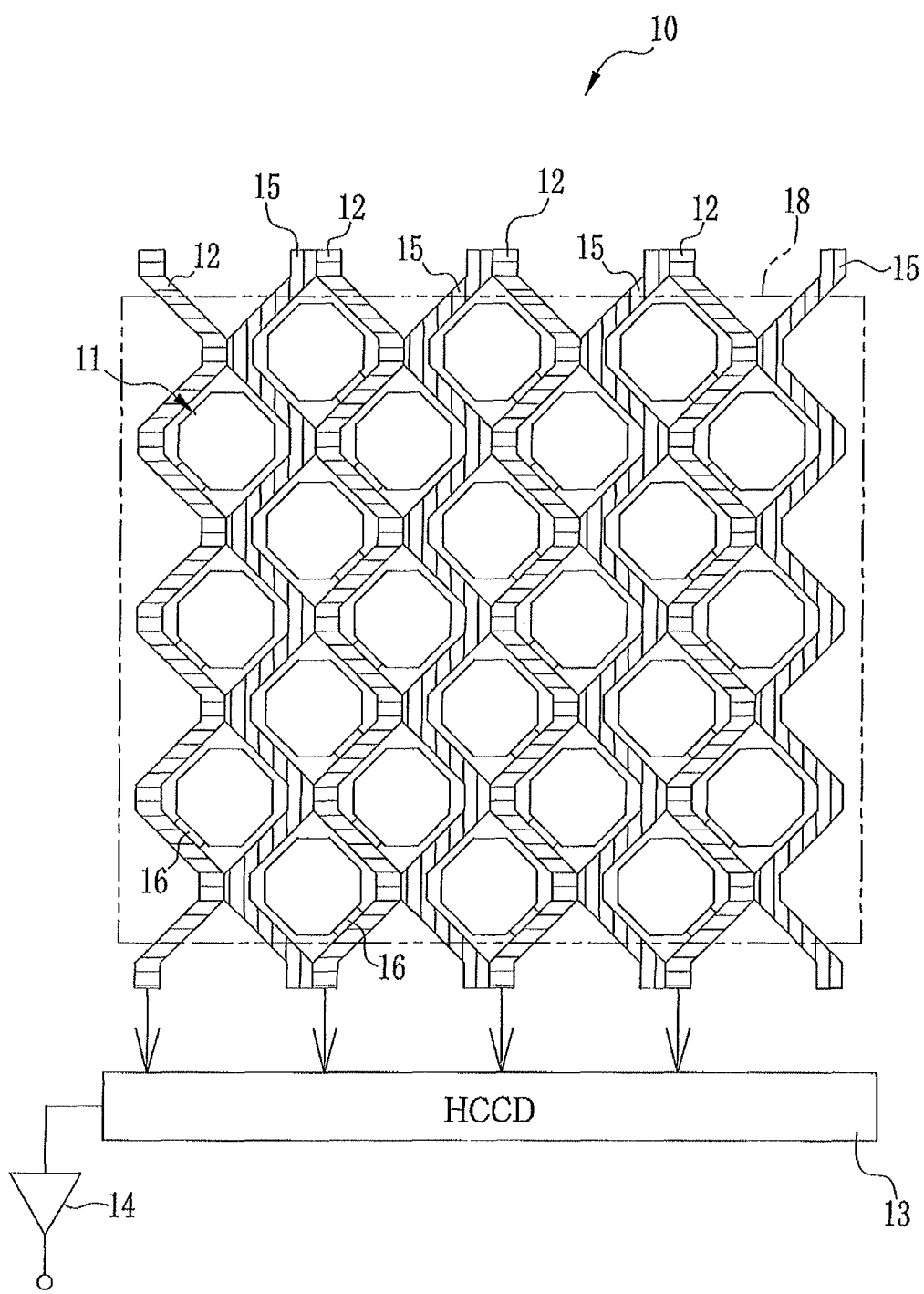
FIG. 1 is an explanatory view illustrating a configuration of a CCD image sensor.

As shown in FIG. 1, a CCD image sensor (solid state imaging device) 10 is provided with a plurality of pixels 11, a plurality of vertical transfer paths (hereinafter referred to as the VCCDs) 12, a horizontal transfer path (hereinafter referred to as the HCCD) 13, a floating diffusion amplifier (hereinafter referred to as the FDA) 14, and element isolation regions 15.

The pixels 11 are arranged in vertical and horizontal directions at a predetermined pitch, and accumulate charge corresponding to incident light. Each of the VCCDs 12 constitutes a charge transfer section that transfers the charge, accumulated by the corresponding pixels 11, in the vertical direction. An end of each of the VCCDs 12 is connected to the HCCD 13. The HCCD 13 transfers the charge, transferred from each of the VCCDs 12, in the horizontal direction. The FDA 14 converts the charge, transferred by the HCCD 13, into a voltage signal (image signal) and outputs the image signal. The element isolation regions 15 isolate the pixels 11 from each other to prevent charge transfer between the adjacent pixels 11.

Each of the pixels 11 has the shape of a square rotated 45 degrees. The pixels 11 are arranged in a so-called honeycomb pattern in which the pixels 11 adjacent in the horizontal direction are shifted from each other by ½ pitch in the vertical direction. In the CCD image sensor 10, the pixels 11 thus arranged constitute a rectangular imaging surface 18 to capture a subject image.

The VCCDs 12 and the element isolation regions 15 meander (zigzag) between and along the pixels 11. The VCCD 12 is connected to the corresponding pixels 11 through readout gates 16. The charge accumulated in the pixels 11 is read to the VCCD 12 through the readout gates 16. The VCCD 12 is controlled by transfer electrodes of four phases (not shown). The VCCD 12 transfers the charge, read out from the pixels 11, in the vertical direction. The VCCDs 12 is disposed along every second row of the pixels 11, so that the VCCD 12 reads out the charge from the pixels 11 arranged on right and left sides of the VCCD 12.

Figure 2:
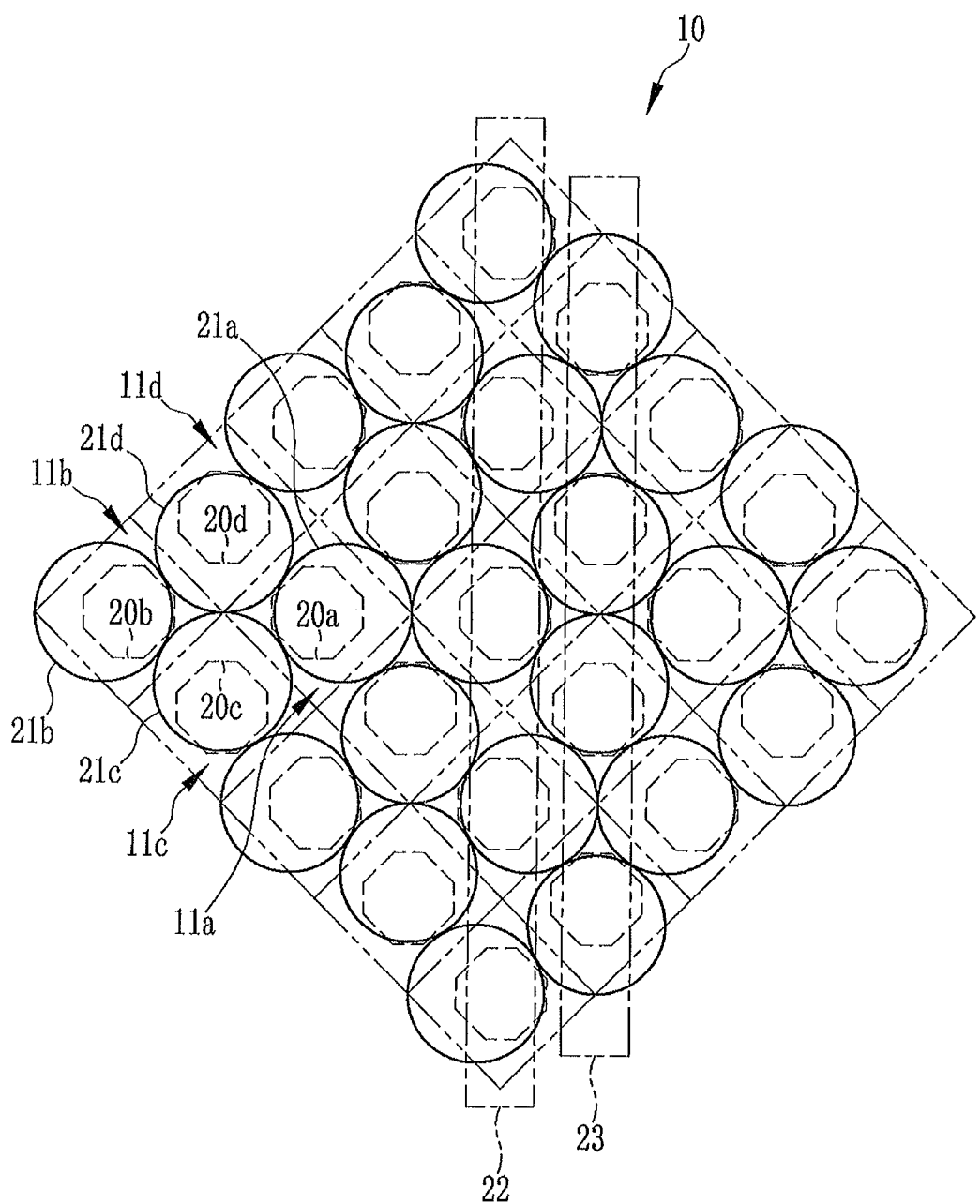
FIG. 2 is an explanatory view illustrating a configuration of each pixel.

As shown in FIG. 2, the CCD image sensor 10 has four types of pixels 11: first pixels 11a, second pixels 11b, third pixels 11c, and fourth pixels 11d. In the CCD image sensor 10, the four types of the pixels 11a to 11d are arranged in a predetermined pattern to constitute the imaging surface 18. Note that in FIGS. 1 and 2, only a part of the CCD image sensor 10 is illustrated for the sake of convenience. Actually, the CCD image sensor 10 is provided with the plurality of pixels 11a to 11d in a two-dimensional arrangement, as is well-known.

The first pixel 11a has a photodiode (PD) 20a, being a photoelectric converter that converts the incident light into the charge and accumulates the charge, and a microlens 21a that condenses the light onto the PD 20a. In a similar manner, the second pixel 11b is provided with a PD 20b and a microlens 21b. The third pixel 11c is provided with a PD 20c and a microlens 21c. The fourth pixel 11d is provided with a PD 20d and a microlens 21d. The PDs 20a to 20d have substantially the same shape and configuration and are formed over a semiconductor substrate. The microlenses 21a to 21d have substantially the same hemispherical shape and size.

An optical axis center of the microlens 21a of the first pixel 11a is eccentric or shifted in a rightward direction from the center of alight receiving surface of the PD 20a. An optical axis center of the microlens 21b of the second pixel 11b is eccentric or shifted in a leftward direction from the center of a light receiving surface of the PD 20b. An optical axis center of the microlens 21c of the third pixel 11c is eccentric or shifted in an upward direction from the center of a light receiving surface of the PD 20c. An optical axis center of the microlens 21d of the fourth pixel 11d is eccentric or shifted in a downward direction from the center of a light receiving surface of the PD 20d.

Here, the rightward, leftward, upward, and downward directions are those relative to the imaging surface 18 of the CCD image sensor 10 when the imaging surface 18 is viewed as in the drawing. In more detail, a direction toward an upstream side in a transfer direction of the VCCD 12 is referred to as the upward. A direction toward a downstream side in a transfer direction of the VCCD 12, namely, a direction toward the HCCD 13, is referred to as the downward. A direction toward an upstream side in the transfer direction of the HCCD 13 is referred to as the right (rightward). A direction toward a downstream side in the transfer direction of the HCCD 13, namely, a direction toward the FDA 14 is referred to as the left (leftward).

Each of the pixels 11a to 11d thus configured selectively receives the incident light depending on its incident angle. To be more specific, in the first pixel 11a with the microlens 21a eccentric or shifted in the rightward direction, it is difficult for the PD 20a to receive light incident from the leftward direction relative to the microlens 21a. In the second pixel 11b with the microlens 21b eccentric or shifted in the leftward direction, it is difficult for the PD 20b to receive light incident from the rightward direction relative to the microlens 21b. In the third pixel 11c with the microlens 21c eccentric or shifted in the upward direction, it is difficult for the PD 20c to receive light incident from the downward direction relative to the microlens 21c. In the fourth pixel 11d with the microlens 21d eccentric or shifted in the downward direction, it is difficult for the PD 20d to receive light incident from the upward direction relative to the microlens 21d.

When the CCD image sensor 10 is employed in an imaging device such as a digital camera, an image produced from an image signal from the first pixels 11a in the imaging surface and an image produced from an image signal from the second pixels 11b in the imaging surface are shifted from each other in a right-left direction depending on a focus state of a taking lens that forms a subject image on the CCD image sensor 10. In a similar manner, an image produced from an image signal from the third pixels 11c and an image produced from an image signal from the fourth pixels 11d are shifted from each other in an up-down direction depending on a focus state of the taking lens.

By detecting an amount and a direction of the shift between the image produced from the image signal from the first pixels 11a and the image produced from the image signal from the second pixels 11b, or an amount and a direction of the shift between the image produced from the image signal from the third pixels 11c and the image produced from the image signal from the fourth pixels 11d, a direction and an amount of movement of a focal lens in the taking lens is obtained to set the focal lens in an in-focus position.

In the CCD image sensor 10, so-called AF of a phase difference method is performed with the use of the image produced using the first pixels 11a and the image produced using the second pixels 11b, or the image produced using the third pixels 11c and the image produced using the fourth pixels 11d. The CCD image sensor 10 is also capable of performing so-called monocular 3D imaging when a pair of images with binocular disparity is obtained using the first and second pixels 11a and 11b or the third and fourth pixels 11c and 11d.

In the CCD image sensor 10, the first and second pixels 11a and 11b are arranged alternately in the up-down direction to constitute a first pixel row 22. The third and fourth pixels 11c and 11d are arranged alternately in the up-down direction to constitute a second pixel row 23. Thereby, in the CCD image sensor 10, spaces in the first and second pixels 11a and 11b, caused by eccentricity or shift of each of the first and second microlenses 21a and 21b, are overlapped by a part of the microlens 21c of the adjacent third pixel 11c and a part of the microlens 21d of the adjacent fourth pixel 11d. Spaces in the third and forth pixels 11c and 11d, caused by eccentricity or shift of each of the third and fourth microlenses 21c and 21d, are overlapped by a part of the microlens 21a of the adjacent first pixel 11a and a part of the microlens 21b of the adjacent second pixel 11b.

Figure 3:
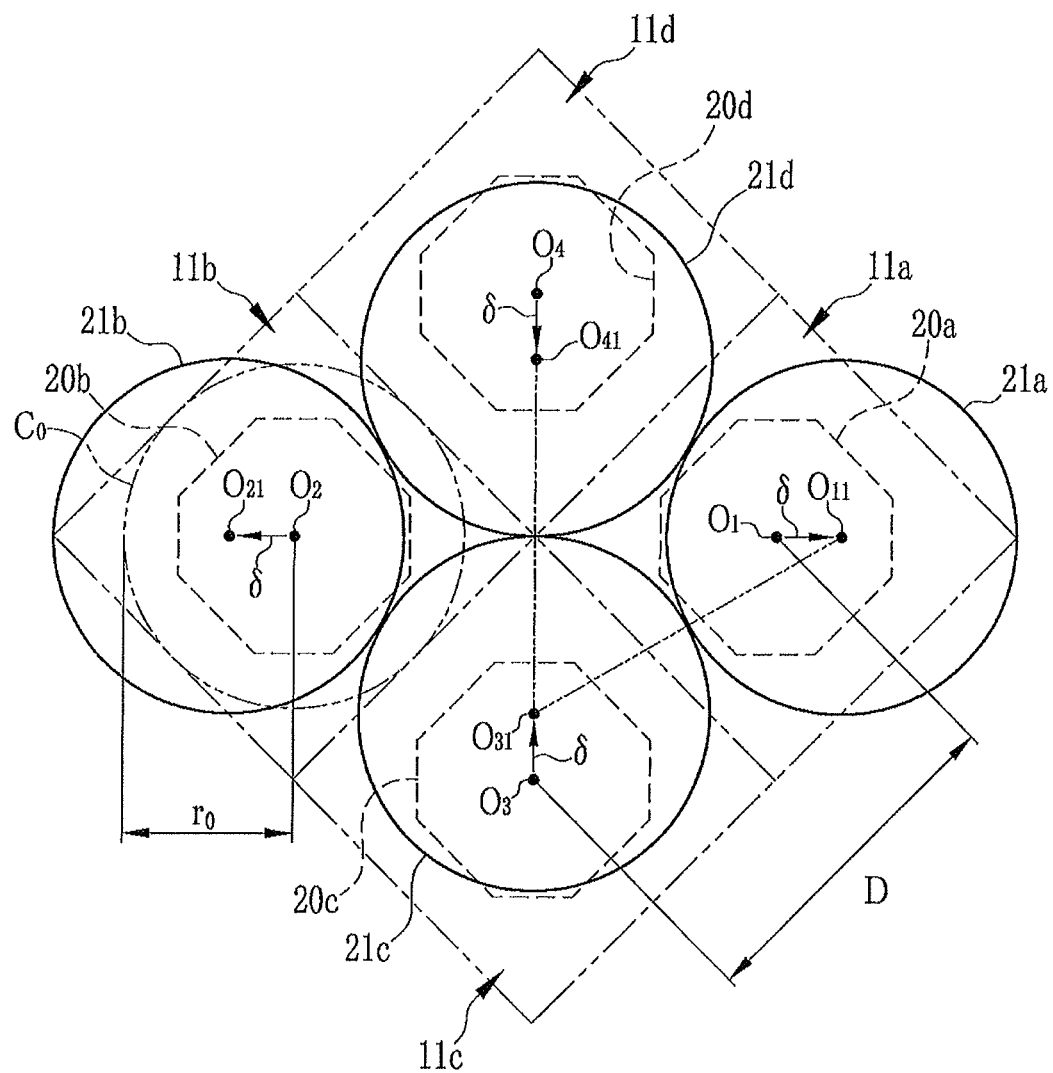
FIG. 3 is an explanatory view illustrating four types of pixels, which are enlarged.

As shown in FIGS. 2 and 3, when the pixels 11a to 11d are arranged as described above, a right end of the first pixel 11a comes in contact with the microlens 21a. A left end of the second pixel 11b comes in contact with the microlens 21b. Similarly, an upper end of the third pixel 11c comes in contact with the microlens 21c. A lower end of the fourth pixel 11d comes in contact with the microlens 21d. By shifting the centers of the microlenses 21a to 21d in corresponding directions, respectively, the size (diameter) of each of the microlenses 21a to 21d is maximized.

Note that, as shown in FIGS. 2 and 3, the microlenses 21a to 21d reach their maximum size(s) when the microlenses 21a to 21d come in contact with the ends of the pixels 11a to 11d, respectively, and each of the microlenses 21a to 21d comes in contact with the microlens (es) of one or more adjacent pixels such that the microlenses 21a to 21d cannot further expand their respective diameters.

The pixels 11a to 11d have substantially the same square shape and size. In each of the pixels 11a to 11d, a length between the center of the light receiving surface of its PD (20a, 20b, 20c, or 20d) and the top edge of the pixel, a length between the center of the light receiving surface and the bottom edge of the pixel, a length between the center of the light receiving surface and the left edge of the pixel, and a length between the center of the light receiving surface and the right edge of the pixel are substantially constant. The microlenses 21a to 21d have substantially the same hemispherical shape. Accordingly, when the microlenses 21a to 21d are eccentric or shifted in the corresponding directions to come in contact with the ends of the pixels 11a to 11d, respectively, amounts of eccentricity of the microlenses 21a to 21d are substantially constant.

As shown in FIG. 3, $O_1$ denotes the center of the light receiving surface of the PD 20a. $O_2$ denotes the center of the light receiving surface of the PD 20b. $O_3$ denotes the center of the light receiving surface of the PD 20c. $O_4$ denotes the center of the light receiving surface of the PD 20d. $O_{11}$ denotes the optical axis center of the microlens 21a. $O_{21}$ denotes the optical axis center of the microlens 21b. $O_{31}$ denotes the optical axis center of the microlens 21c. $O_{41}$ denotes the optical axis center of the microlens 21d. $\delta$ denotes the amount of eccentricity or shift of each of the microlenses 21a to 21d. D denotes each of an arrangement pitch of the pixels 11a, an arrangement pitch of the pixels 11b, an arrangement pitch of the pixels 11c, and an arrangement pitch of the pixels 11d in an oblique direction (the arrangement pitch D has the same length as a side of each of the square pixels 11a to 11d). $r_0$ denotes a radius of a maximum circle $C_0$ (a maximum inscribed circle, in each of the square pixels 11a to 11d, having a center point, being the center of the light receiving surface). A distance $O_{11}O_{31}$ between the optical axis center $O_{11}$ of the microlens 21a and the optical axis center $O_{31}$ of the microlens 21c is represented by an expression (1) using Pythagorean theorem. The distance $O_{31}O_{41}$ between the optical axis center $O_{31}$ of the microlens 21c and the optical axis center $O_{41}$ of the microlens 21d is represented by an expression (2).

$$O_{11}O_{31} = \sqrt{\left(\frac{\delta}{\sqrt{2}} + \frac{\delta}{\sqrt{2}}\right)^2 + d^2} \quad (1)$$
$$= \sqrt{2\delta^2 + d^2}$$
$$= \sqrt{2\delta^2 + 4r_0^2}$$

$$O_{31}O_{41} = \sqrt{\left(d - \frac{\delta}{\sqrt{2}} - \frac{\delta}{\sqrt{2}}\right)^2 + \left(d - \frac{\delta}{\sqrt{2}} - \frac{\delta}{\sqrt{2}}\right)^2} \quad (2)$$
$$= \sqrt{2(d - 2\delta)^2}$$
$$= \sqrt{2(2r_0 - 2\delta)^2}$$
$$= 2\sqrt{2}\,(r_0 - \delta)$$

As described above, when the size of each of the microlenses 21a to 21d is maximized, the microlenses 21a, 21c, and 21d of the first, third, and fourth pixels 11a, 11c, 11d adjacent to each other come in contact with each other. When the three adjacent circles (the microlenses 21a, 21c, and 21d) are in contact with each other, lines between the centers the three circles form an equilateral triangle. A midpoint of each line (side) of the equilateral triangle touches the point of contact of two circles. Accordingly, as shown in FIG. 3, where $r_{max}$ denotes a maximum radius of each of the microlenses 21a to 21d, each of the distance $O_{11}O_{31}$ and the distance $O_{31}O_{41}$ is twice the maximum radius $r_{max}$, that is, the diameter of each of the maximized microlenses 21a to 21d.

$$2r_{max} = O_{11}O_{31} = O_{11}O_{41} \quad (3)$$

By substituting the expressions (1) and (2) for the expression (3), a polynomial expression (4) is obtained. The polynomial expression (4) is solved for δ to obtain a solution shown by an expression (5).

$$2\sqrt{2}(r_0 - \delta) = \sqrt{2\delta^2 + 4r_0^2} \quad (4)$$
$$8(r_0 - \delta)^2 = 2\delta^2 + 4r_0^2$$
$$4(r_0^2 - 2\delta r_0 + \delta^2) = \delta^2 + 2r_0^2$$
$$3\delta^2 - 8\delta r_0 + 2r_0^2 = 0$$

$$\delta = \frac{8r_0 \pm \sqrt{64r_0^2 - 4 \cdot 3 \cdot 2r_0^2}}{6} \quad (5)$$
$$= \frac{4 \pm \sqrt{10}}{3} r_0$$

When the value δ exceeds the value $r_0$, the microlenses 21a to 21d overlap the adjacent pixels 11. The range of δ, therefore, needs to satisfy δ<$r_0$. When this condition is applied to the expression (5), the maximum value $\delta_{max}$ of the value δ is approximately 0.279 times the $r_0$ as shown by an expression (6).

$$\delta_{max} = \frac{4 \pm \sqrt{10}}{3} r_0 \quad (6)$$
$$= \frac{4 - \sqrt{10}}{3} r_0$$
$$\approx 0.279 r_0$$

By substituting the maximum value $\delta_{max}$ for the δ in the expression (1), the distance $O_{11}O_{31}$ is approximately 1.0193 times the diameter of the maximum circle $C_0$ as shown by an expression (7), in other words, the maximum radius $r_{max}$ is approximately 1.0193 times the radius $r_0$ of the maximum circle $C_0$.

$$O_{11}O_{31}|_{\delta max} = \sqrt{2\left(\frac{4-\sqrt{10}}{3}\right)^2 r_0^2 + 4r_0^2} \quad (7)$$
$$= \sqrt{2\frac{16 - 8\sqrt{10} + 10}{9} + 4} \cdot r_0$$
$$= \sqrt{2\frac{26 - 8\sqrt{10}}{9} + 4} \cdot r_0$$
$$= 2\sqrt{2\frac{11 - 2\sqrt{10}}{9}} \cdot r_0$$
$$= \frac{2}{3}\sqrt{2} \sqrt{(\sqrt{10} - 1)^2} \cdot r_0$$

$$= \frac{\sqrt{2}}{3}(\sqrt{10} - 1) \cdot r_0$$
$$\approx 1.0193 \cdot (2r_0)$$

According to this embodiment, a radius of each of the microlenses 21a to 21d of the pixels 11a to 11d, being the phase difference detection pixels, is approximately 1.0193 times longer than that of the maximum circle $C_0$. An area of each of the microlenses 21a to 21d is approximately 1.0398 times larger than that of the maximum circle $C_0$. This increases the sensitivity of each of the pixels 11a to 11d to the light incident on the center of the light receiving surface through the microlens. To make the pixels 11a to 11d function as the phase difference detection pixels, it is only necessary to form the microlenses 21a to 21d. It is not necessary to additionally provide a pupil forming microlens as described in the Japanese Patent Laid-Open Publication No. 2007-158109. Thus, the manufacturing cost of the CCD image sensor 10 does not increase.

Figure 4:
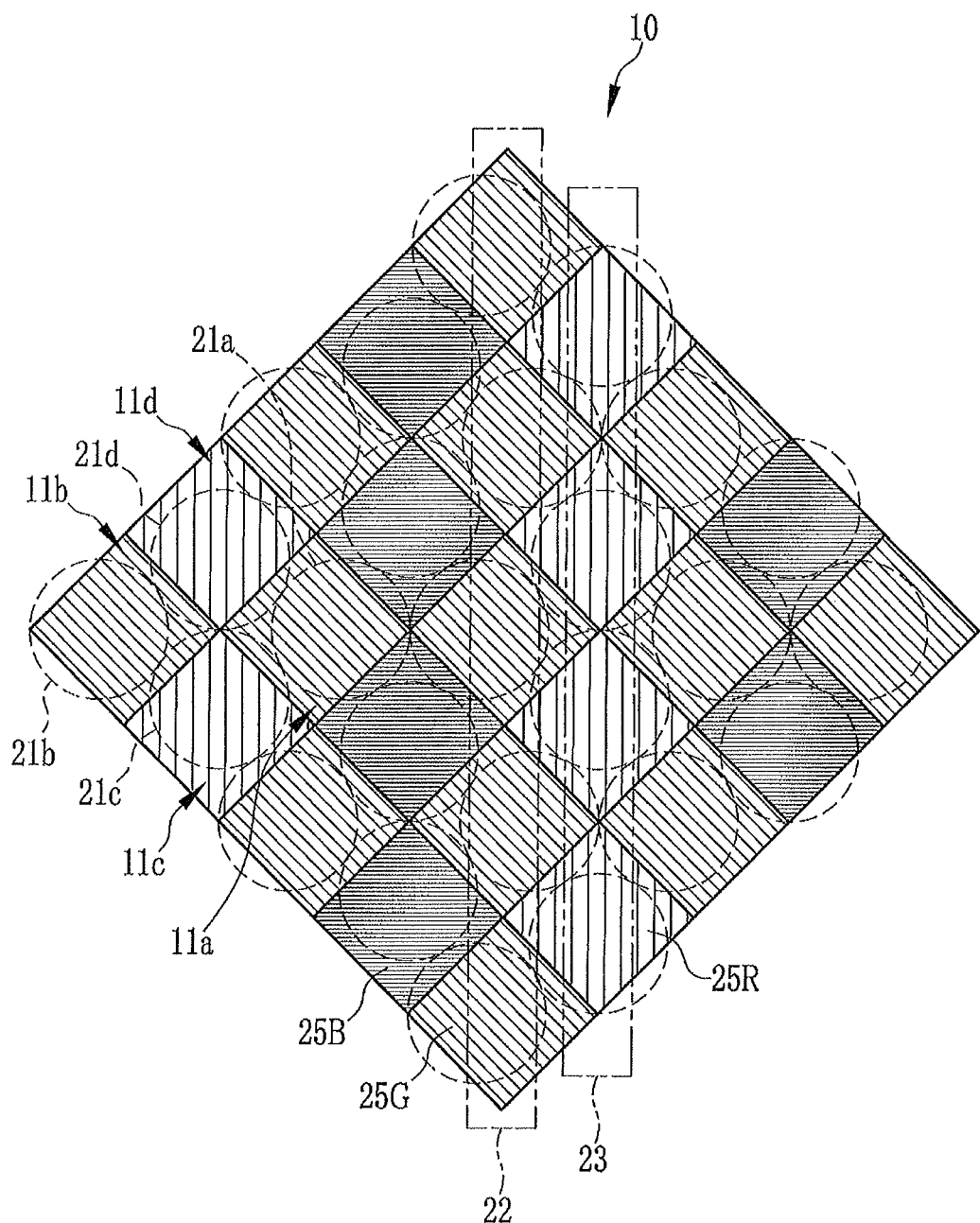
FIG. 4 is an explanatory view illustrating an example in which each of the pixels is provided with a color filter.

As shown in FIG. 4, the above-configured CCD image sensor 10 may be provided with red color filters 25R for transmitting red light, green color filters 25G for transmitting green light, and blue color filters 25B for transmitting blue light. One of the color filters 25R, 25G, and 25B is formed right over each of the pixels 11a to 11d. Each of the color filters 25R, 25G, and 25B has a square shape. Note that in FIG. 4, the PDs 20a to 20d are not illustrated for the sake of convenience. In the drawings of this specification, vertical hatching represents the color red, 45-degree diagonal hatching represents the color green, and horizontal hatching represents the color blue.

As is well known, the color filters 25R, 25G, and 25B are provided between the PDs 20a to 20d of the pixels 11a to 11d and the microlenses 21a to 21d. Each of the color filters 25R, 25G, and 25B is a thin film having substantially the same square shape as an external shape of each of the pixels 11a to 11d. One of the color filters 25R, 25G, and 25B is disposed right over each of the pixels 11a to 11d (PDs 20a to 20d). Out of the light condensed by each of the microlenses 21a to 21d, the color filter 25R transmits a red component. The color filter 25G transmits a green component. The color filter 25B transmits a blue component. One of the red, green, and blue components is incident on each of the PDs 20a to 20d.

The green color filters 25G are provided to the first pixels 11a and the second pixels 11b. The green color filters 25G are arranged such that every pixel 11 in the first pixel row 22 is the green pixel 11. The red and blue color filters 25R and 25B are provided to the third and fourth pixels 11c and 11d. The red and blue color filters 25R and 25B are arranged such that the first pixel row 22 composed of the green pixels 11 is disposed between the second pixel row 23 composed of the red pixels 11 and the second pixel row 23 composed of the blue pixels 11.

In other words, the color filters 25R, 25G, and 25B are disposed on the pixels 11a to 11d such that the first pixel row 22 composed of the green pixels 11, the second pixel row 23 composed of the red pixels 11, the first pixel row 22 composed of the green pixels 11, and the second pixel row 23 composed of the blue pixels 11 are arranged in this order repeatedly in the right-left direction.

By arranging the color filters 25R, 25G, and 25B in the above-described pattern, the number of the green pixels 11, having a peak of spectral sensitivity similar to that of human eye sensitivity, is twice the number of the red pixels 11 and twice the number of the blue pixels 11. This improves apparent resolution. The pixels 11 of the same green color are used as the first and second pixels 11a and 11b for detecting a shift amount in the right-left direction. Thereby, the accuracy of the phase difference AF is improved.

The color of the pixel 11 is determined on a row-by-row basis in the pixel rows 22 and 23. Because the pixel arrangement direction and the transfer direction of the VCCD 12 are parallel with each other, the VCCD 12 transfers the signal charge of the single color. This prevents color mixture. In addition, pixel addition of the adjacent first and second pixels 11a and 11b and pixel addition of the adjacent third and fourth pixels 11c and 11d may be performed to achieve high sensitivity. After the pixel addition, positions of center gravity of pixels form a Bayer pattern. Hence, an image is produced by signal processing corresponding to the Bayer pattern. Note that when the pixel addition is not performed, an RGB stripe filter process may be used to produce an image.

(Second Embodiment)

Figure 5:
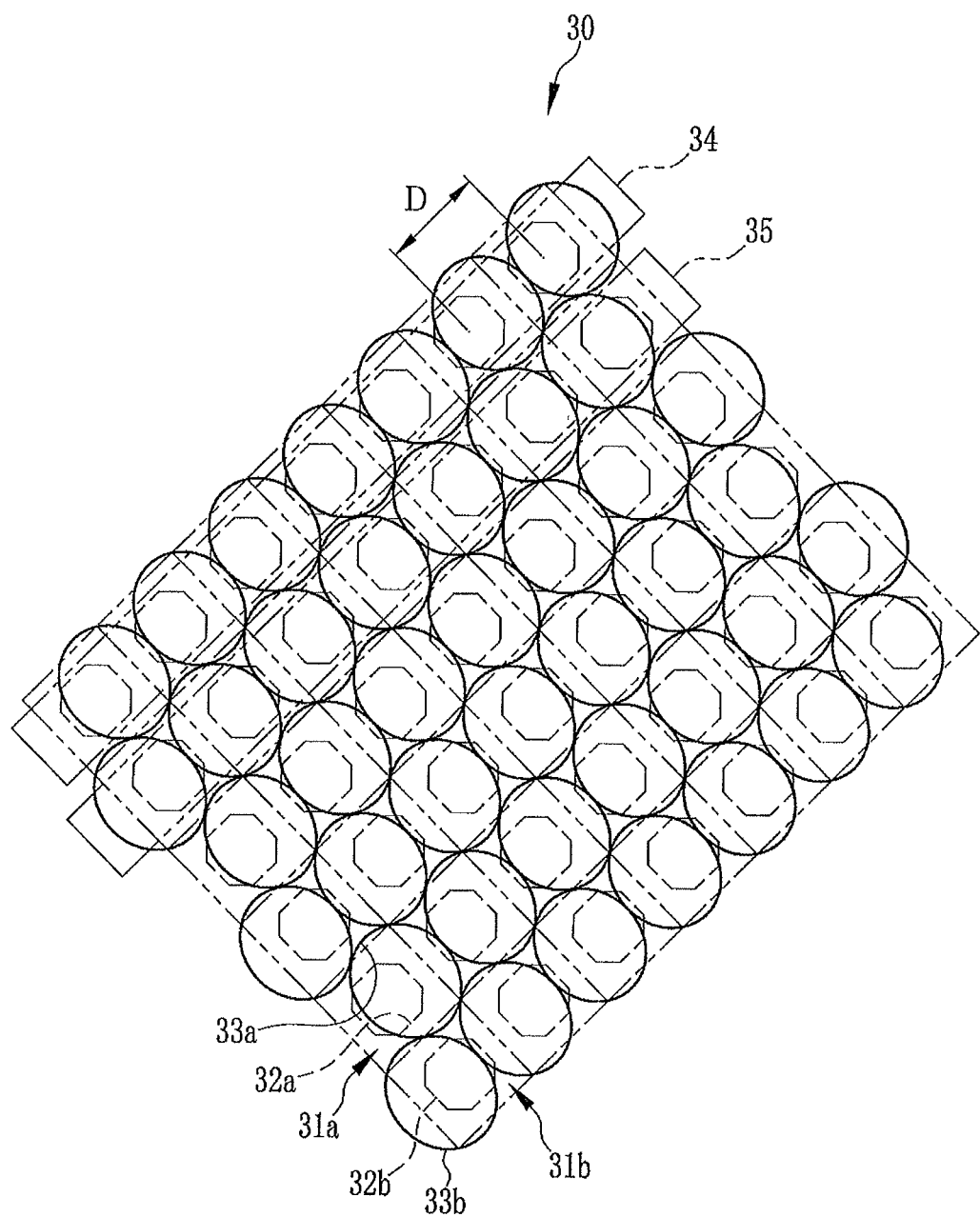
FIG. 5 is an explanatory view illustrating an arrangement in which one of the two adjacent pixels has high sensitivity and the other has low sensitivity.

Next, a second embodiment of the present invention is described. Note that the parts functionally and structurally similar to those in the first embodiment are designated by the same numerals as in the first embodiment, and descriptions thereof are omitted. As shown in FIG. 5, a CCD image sensor 30 of this embodiment has two types of pixels: first pixels 31a and second pixels 31b. Similar to the first embodiment, each of the pixels 31a and 31b has the shape of a square rotated 45 degrees. The pixels 31a and 31b are arranged in a honeycomb pattern.

Similar to the above embodiment, each pixel 31a is provided with a PD 32a and a microlens 33a and each pixel 31b is provided with a PD 32b and a microlens 33b. The optical axis center of the microlens 33a of the first pixel 31a is shifted by approximately 45 degrees in an obliquely upper right direction from the center of the light receiving surface of the PD 32a. The optical axis center of the microlens 33b of the second pixel 31b is shifted by approximately 45 degrees in an obliquely lower left direction from the center of the light receiving surface of the PD 32b. The amounts of eccentricity of the microlenses 33a and 33b in the respective directions are substantially the same. Where δ denotes the amount of eccentricity or shift and D denotes each of an arrangement pitch, in an oblique direction, of the pixels 31a arranged parallel with the eccentricity direction of the microlenses 33a and an arrangement pitch, in an oblique direction, of the pixels 31b arranged parallel with the eccentricity direction of the microlenses 33b, the δ is approximately D/3.

The CCD image sensor 30 has first pixel rows 34 and second pixel rows 35. Each of the first pixel rows 34 is composed of the first pixels 31a arranged in the eccentricity direction of the microlens 33a. Each of the second pixel rows 35 is composed of the second pixels 31b arranged in the eccentricity direction of the microlens 33b. A space caused by the eccentric microlens 33a is overlapped by a part of the microlens 33a of the adjacent first pixel 31a. A space caused by the eccentric microlens 33b is overlapped by a part of the microlens 33b of the adjacent second pixel 31b. The pixel rows 34 and 35 are arranged alternately in a direction substantially orthogonal to the eccentricity direction.

Each of the microlenses 33a and 33b has the shape of a semi-ellipsoid (an ellipsoid of revolution cut in half) with a major axis extending in a direction substantially orthogonal to the eccentricity direction so as to overlap planar spaces in a direction substantially orthogonal to the eccentricity direction. The length of the minor axis of each of the microlenses 33a and 33b is substantially the same as the D. The major axis of each of the microlenses 33a and 33b is approximately 2/√3 times longer than the D. Hence, a part of the microlens 33a in the minor axis direction overlaps the adjacent first pixel 31a, and end portions of the microlens 33a in the major axis direction overlap the respective adjacent second pixels 31b in a direction substantially orthogonal to the eccentricity direction. A part of the microlens 33b in the minor axis direction overlaps the adjacent second pixel 31b, and end portions of the microlens 33b in the major axis direction overlap the respective adjacent first pixels 31a in a direction substantially orthogonal to the eccentricity direction.

In the CCD image sensor 30 thus configured, the size of each of the microlenses 33a and 33b is larger than the size of the maximum circle $C_0$ having the diameter D by the length of the major axis of the ellipsoidal-shaped microlens 33a or 33b. In other words, the size of each of the microlenses 33a and 33b is approximately 2/√3 times (≈1.154 times) the size of the maximum circle $C_0$. This improves sensitivity of each of the pixels 31a and 31b with no cost increase in a manner similar to the first embodiment.

Figure 6:
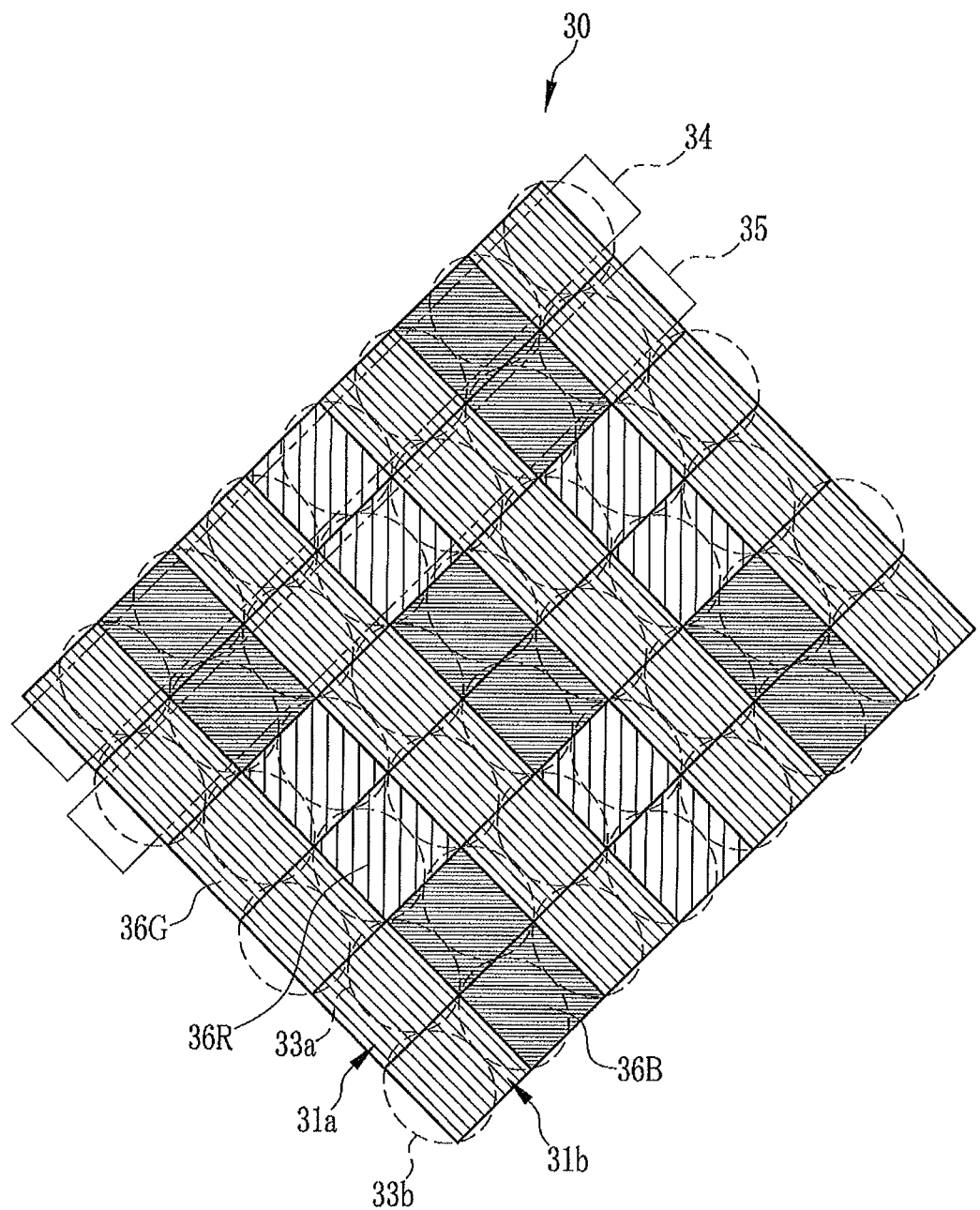
FIG. 6 is an explanatory view illustrating an example in which the pixels of FIG. 5 are provided with the color filters.

FIG. 6 illustrates pixel rows of "Super CCD Honeycomb EXR" (the name of the product manufactured by the applicant). In the CCD image sensor 30, each of four pixels, arranged in a direction orthogonal to the pixel rows 34 and 35, is provided with a green color filter 36G. Another four pixels are arranged parallel with and adjacent to the four pixels with the green color filters 36G. Each of the two adjacent pixels out of the another four pixels is provided with a red color filter 36R. Each of the other two adjacent pixels out of the another four pixels is provided with a blue color filter 36B. The color filters 36G, 36R, and 36B are arranged in units of the eight color filters (the four green color filters 57G, the two red color filter 57R, and the two blue color filter 57B). The arrangement of the pixels 31a and 31b in the CCD image sensor 30 is suitable for arranging the color filters 36R, 36G, and 36B in this manner.

In the CCD image sensor 30, a set of the two pixels with the respective red color filters 36R and a set of the two pixels with the respective blue color filters 36B are arranged alternately in a direction orthogonal to the pixel rows 34 and 35. The red color filter 36R and the blue color filter 36B are arranged alternately, with the green color filter 36G between the red and blue color filters 36R and 36B, in a direction parallel with the pixel rows 34 and 35.

Each of the color filters 36R, 36G, and 36B is a thin film having substantially the same square shape as the external shape of each of the pixels 31a and 31b. One of the color filters 36R, 36G, and 36B is disposed right over each of the pixels 31a and 31b. Note that in FIG. 6, the PDs 32a and 32b are not illustrated for the sake of convenience.

One of the adjacent pixels 31a and 31b has high sensitivity. The other pixel has low sensitivity. An image with a wide dynamic range is produced from output values of the pixels 31a and 31b. Thus, the CCD image sensor 30 improves the sensitivity of each of the pixels 31a and 31b, and allows the microlenses 33a and 33b of the pixels 31a and 31b, being the high and low sensitivity pixels, to be eccentric or shifted in opposite directions to each other. The high and low sensitivities are apparent sensitivities obtained by electrically controlling exposure time. It is not necessary to additionally provide low sensitivity pixels with reduced lens areas for widening the dynamic range.

In this embodiment, the semi-ellipsoidal shaped microlenses 33a and 33b are formed such that their major axes extend substantially orthogonal to the eccentricity directions of the microlenses 33a and 33b, respectively. A part of each of the microlenses 33a and 33b may overlap the pixel 31a or 31b adjacent in a direction substantially orthogonal to the eccentricity direction, at least partly occupying the planar space caused by the eccentricity. Namely, each of the microlenses 33a and 33b is elongated at least in the direction substantially orthogonal to the eccentricity direction. The major axis of each of the microlenses 33a and 33b may be tilted by a predetermined angle relative to the direction substantially orthogonal to the eccentricity direction. The shapes of the microlenses 33a and 33b are not limited to the semi-ellipsoidal shapes. Each of the microlenses 33a and 33b may have any shape elongated in the direction substantially orthogonal to the eccentricity direction.

(Third Embodiment)

Figure 7:
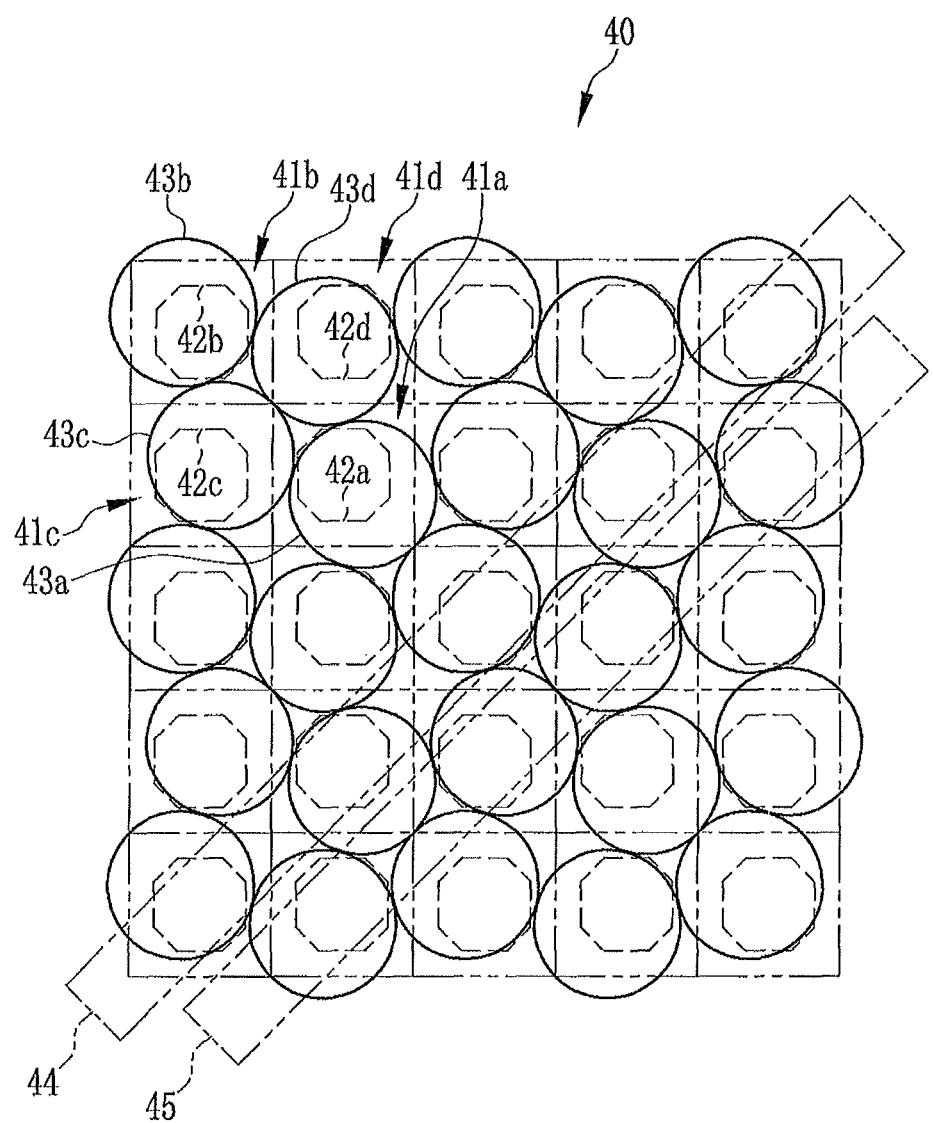
FIG. 7 is an explanatory view illustrating an example in which the pixels are arranged to correspond to a simple square lattice pattern.

Next, a third embodiment of the present invention is described. As shown in FIG. 7, a CCD image sensor 40 of this embodiment has four types of pixels: first pixels 41a, second pixels 41b, third pixels 41c, and fourth pixels 41d. Each of the pixels 41a to 41d has a square shape. The pixels 41a to 41d are arranged in horizontal and vertical directions to form a simple square lattice pattern. Note that, in the simple square lattice pattern, the VCCDs 12 and the HCCD 13 may be arranged in a well-known configuration.

Similar to the above embodiments, the pixel 41a is provided with a PD 42a and a microlens 43a. The pixel 41b is provided with a PD 42b and a microlens 43b. The pixel 41c is provided with a PD 42c and a microlens 43c. The pixel 41d is provided with a PD 42d and a microlens 43d. An optical axis center of the microlens 43a of the first pixel 41a is shifted by approximately 45 degrees in an obliquely lower right direction from a center of a light receiving surface of the PD 42a. An optical axis center of the microlens 43b of the second pixel 41b is shifted by approximately 45 degrees in an obliquely upper left direction from a center of a light receiving surface of the PD 42b. An optical axis center of the microlens 43c of the third pixel 41c is shifted by approximately 45 degrees in an obliquely upper right direction from the center of a light receiving surface of the PD 42c. An optical axis center of the microlens 43d of the fourth pixel 41d is shifted by approximately 45 degrees in an obliquely lower left direction from the center of a light receiving surface of the PD 42d.

The CCD image sensor 40 is composed of first pixel rows 44 and second pixel rows 45. Each of the first pixel rows 44 has the first and second pixels 41a and 41b arranged alternately in a 45-degree oblique direction. Each of the second pixel rows 45 has the third and fourth pixels 41c and 41d arranged alternately in the 45-degree oblique direction. The pixel rows 44 and 45 are arranged alternately in a direction orthogonal to the pixel rows 44 and 45. Thereby, a space is caused between the eccentric microlens 43a of the first pixel 41a and the eccentric microlens 43b of the second pixel 41b.

The space is overlapped by a part of the microlens 43c of the adjacent third pixel 41c and a part of the microlens 43d of the adjacent fourth pixel 41d. A space between the eccentric third microlens 43c of the third pixel 41c and the eccentric fourth microlens 43d of the fourth pixel 41d is overlapped by a part of the microlens 43a of the adjacent first pixel 41a and a part of the microlens 43b of the adjacent second pixel 41b.

In the CCD image sensor 40, the arrangement of the pixels 11a to 11d in the CCD image sensor 10 of the first embodiment is rotated 45 degrees to form the simple square lattice pattern. Thereby, in the CCD image sensor 40 with the square lattice pattern, the pixels 41a and 41d are arranged in a manner similar to the first embodiment. Thus, the use of the CCD image sensor 40 of this embodiment produces the effect similar to that in the first embodiment.

(Fourth Embodiment)

Figure 8:
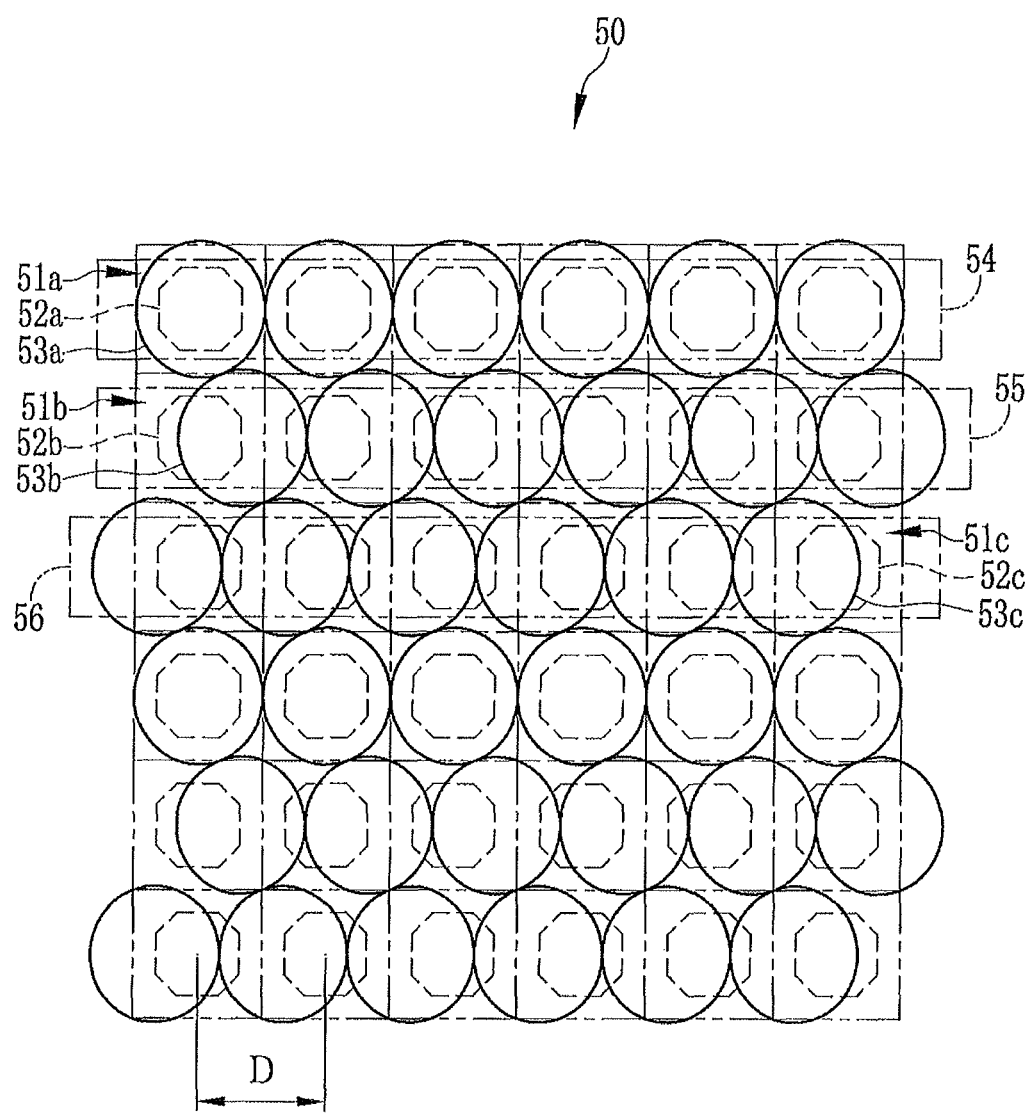
FIG. 8 is an explanatory view illustrating an example in which the pixels are arranged so as to arrange the color filters in a Bayer pattern.

Next, a fourth embodiment of the present invention is described. As shown in FIG. 8, a CCD image sensor 50 of this embodiment has three types of pixels: first pixels 51a, second pixels 51b, and third pixels 51c. Similar to the third embodiment, each of the pixels 51a to 51c has a square shape, and the pixels 51a to 51c are arranged in a simple square lattice pattern. The first pixels 51a are normal pixels. The second and third pixels 51b and 51c are the phase difference detection pixels.

Similar to the above embodiments, each pixel 51a is provided with a PD 52a and a microlens 53a. Each pixel 51b is provided with a PD 52b and a microlens 53b. Each pixel 51c is provided with a PD 52c and a microlens 53c. An optical axis center of the microlens 53a of the first pixel 51a is substantially coincident with a center of a light receiving surface of the PD 52a. An optical axis center of the microlens 53b of the second pixel 51b is shifted in a rightward direction from a center of a light receiving surface of the PD 52b. An optical axis center of the microlens 53c of the third pixel 51c is shifted in a leftward direction from a center of a light receiving surface of the PD 52c. An amount of eccentricity of the microlens 53b in the rightward direction and an amount of eccentricity of the microlens 53c in the leftward direction are substantially the same. Where δ denotes the amount of eccentricity, and D denotes each of an arrangement pitch of the pixels 51a, an arrangement pitch of the pixels 51b, and an arrangement pitch of the pixels 51c in the direction parallel with the eccentricity direction of each of the microlenses 53b and 53c, the δ is approximately D/3.

The CCD image sensor 50 has first pixel rows 54, second pixel rows 55, and third pixel rows 56. The first pixel row 54 has first pixels 51a arranged in a direction parallel with the eccentricity direction of each of the microlenses 53b and 53c. The second pixel row 55 has second pixels 51b arranged in the eccentricity direction. The third pixel row 56 has third pixels 51c arranged in the eccentricity direction. The eccentric microlens 53b causes a space in the second pixel 51b. The space is overlapped by a part of the microlens 53b of the adjacent second pixel 51b. The eccentric microlens 53c causes a space in the third pixel 51c. The space is overlapped by a part of the microlens 53c of the adjacent third pixel 51c. The pixel rows 54 to 56 are arranged in this order repeatedly in a direction substantially orthogonal to the eccentricity direction.

Each of the microlenses 53a to 53c has a semi-ellipsoidal shape with the major axis extending in a direction substantially orthogonal to the eccentricity direction. Thereby, each of the microlenses 53a to 53c overlaps the planar space, caused by the eccentricity of both the microlenses 53b and 53c, as described above, in a direction substantially orthogonal to the eccentricity direction. The length of the minor axis of each of the microlenses 53a to 53c is substantially the same as the D. The major axis of each of the microlenses 53a to 53c is slightly longer than the D, in accordance with the area of the planar space caused by the eccentricity. Hence, a part of the end portions of each of the microlenses 53a to 53c overlaps at least one of the adjacent pixels 51a, 51b, or 51c in a direction substantially orthogonal to the eccentricity direction.

In the CCD image sensor 50 thus configured, the size of each of the microlenses 53a to 53c is enlarged by the length of the major axis as compared with the size of the maximum circle $C_0$ having the diameter D. Accordingly, the sensitivity of each of the pixels 51a to 51c is improved with no cost increase, in a manner similar to the above embodiments. Every third row of the pixel rows is the first pixel row 54 composed of the first pixels 51a (normal pixels) having the microlenses 53a with no eccentricity. This provides multiple views.

Figure 9:
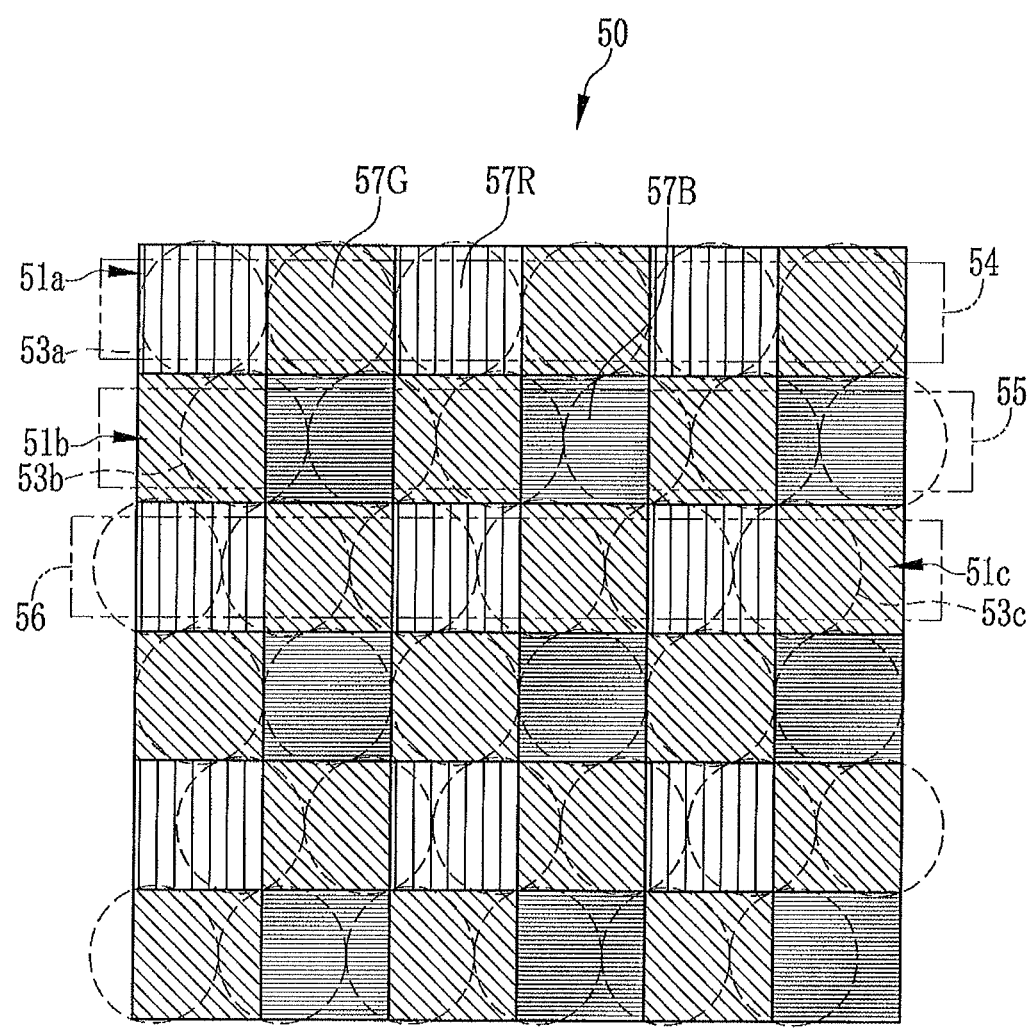
FIG. 9 is an explanatory view illustrating an example in which the color filters are arranged in the Bayer pattern.

As shown in FIG. 9, in the CCD image sensor 50, two obliquely arranged pixels out of four pixels arranged in a lattice pattern of 2×2 are provided with green color filters 57G. One of the two remaining pixels is provided with a red color filter 57R, and the other is provided with a blue color filter 57B. In the CCD image sensor 50, the green, red, and blue color filters 57G, 57R, and 57B are arranged in units of the four color filters (the two green color filters 57G, the red color filter 57R, and the blue color filter 57B) over the pixels 51a to 51c.

The arrangement of the pixels 51a to 51c in the CCD image sensor 50 is suitable for arranging the color filters 57R, 57G, and 57B in the so-called Bayer pattern. Note that a method for forming the color filters 57R, 57G, and 57B may be similar to the above embodiments.

(Fifth Embodiment)

Figure 10:
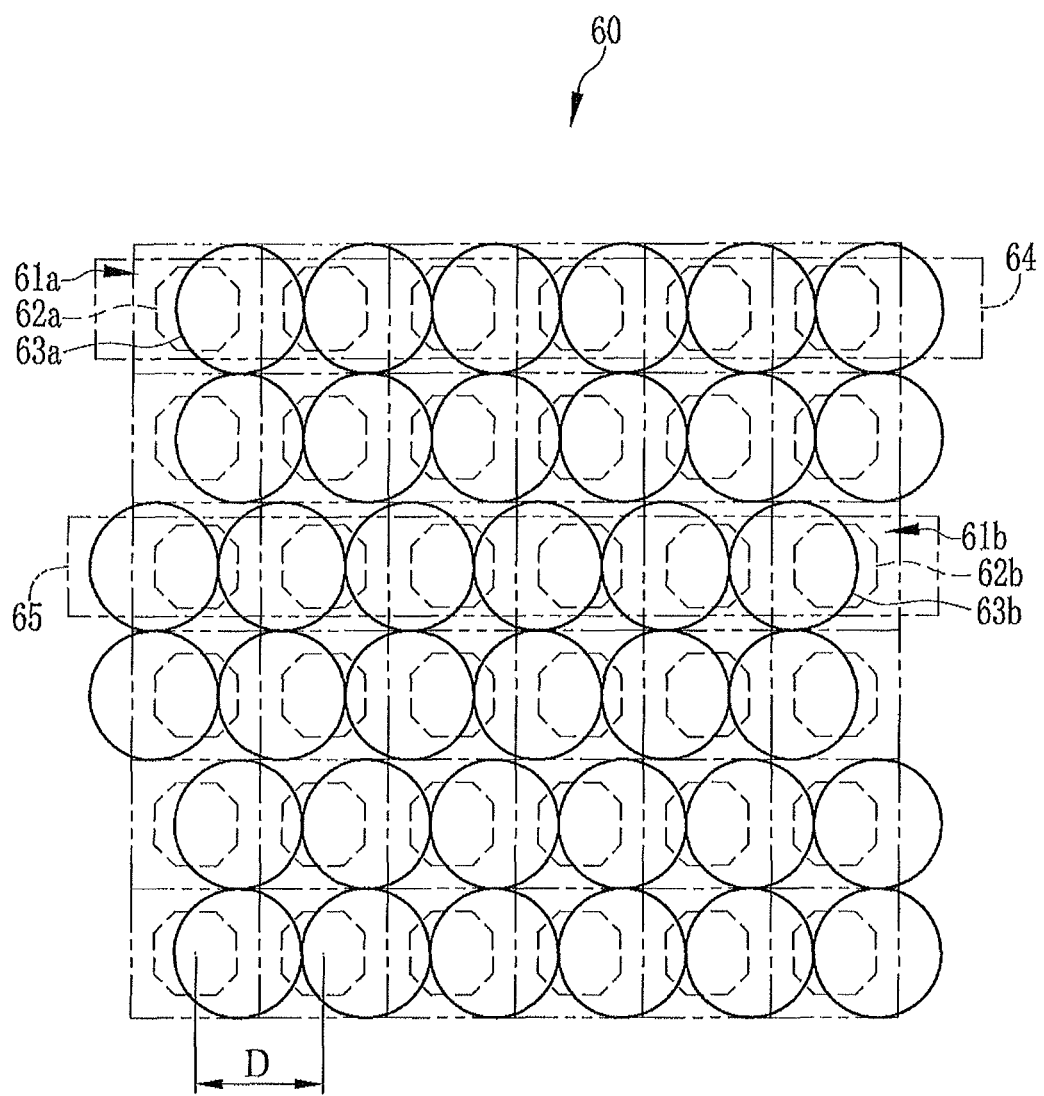
FIG. 10 is an explanatory view illustrating an example in which two rows of pixels with microlenses arranged eccentrically in one direction and two rows of pixels with microlenses arranged eccentrically in the other direction are arranged in this order repeatedly.

The color filters may be arranged in a Bayer pattern shown in a CCD image sensor 60 in FIG. 10. The CCD image sensor 60 has two types of phase difference detection pixels: first pixels 61a and second pixels 61b. Similar to the above embodiments, each of the pixels 61a and 61b has a square shape, and the pixels 61a and 61b are arranged in a simple square lattice pattern.

Similar to the above embodiments, each pixel 61a is provided with a PD 62a and a microlens 63a. Each pixel 61b is provided with a PD 62b and a microlens 63b. An optical axis center of the microlens 63a of the first pixel 61a is shifted in a rightward direction from a center of a light receiving surface of the PD 62a. An optical axis center of the microlens 63b of the second pixel 61b is shifted in a leftward direction from a center of a light receiving surface of the PD 62b. An amount of eccentricity of the microlens 63a in the rightward direction and the amount of eccentricity of the microlens 63b in the leftward direction are substantially the same. Where δ denotes the amount of eccentricity and D denotes each of an arrangement pitch of the pixels 61a and an arrangement pitch of the pixels 61b in a direction parallel with an eccentricity direction of each of the microlenses 63a and 63b, the δ is approximately D/3.

The CCD image sensor 60 has first pixel rows 64 and second pixel rows 65. The first pixel row 64 has first pixels 61a arranged parallel with an eccentricity direction of each of the microlenses 63a and 63b. The second pixel row 65 has second pixels 61b arranged in the eccentricity direction. The eccentric microlens 63a causes a space in the first pixel 61a. The space is overlapped by a part of the microlens 63a of the adjacent first pixel 61a. The eccentric microlens 63b causes a space in the second pixel 61b. The space is overlapped by a part of the microlens 63b of the adjacent second pixel 61b. The first pixel rows 64 and the second pixel rows 65 are arranged on a two-row by two-row basis in a direction substantially orthogonal to the eccentricity direction.

Each of the microlenses 63a and 63b has a substantially hemispherical shape with a diameter D. Hence, in the CCD image sensor 60, each of the microlenses 63a and 63b of the respective pixels 61a and 61b, being the phase difference detection pixels, is formed with the same size as the normal pixel in which the optical axis is coincident with the center of the light receiving surface of the PD 62a or 62b. The pupil forming microlens is unnecessary. Thus, the sensitivities of the pixels 61a and 61b are improved with no cost increase.

Figure 11:
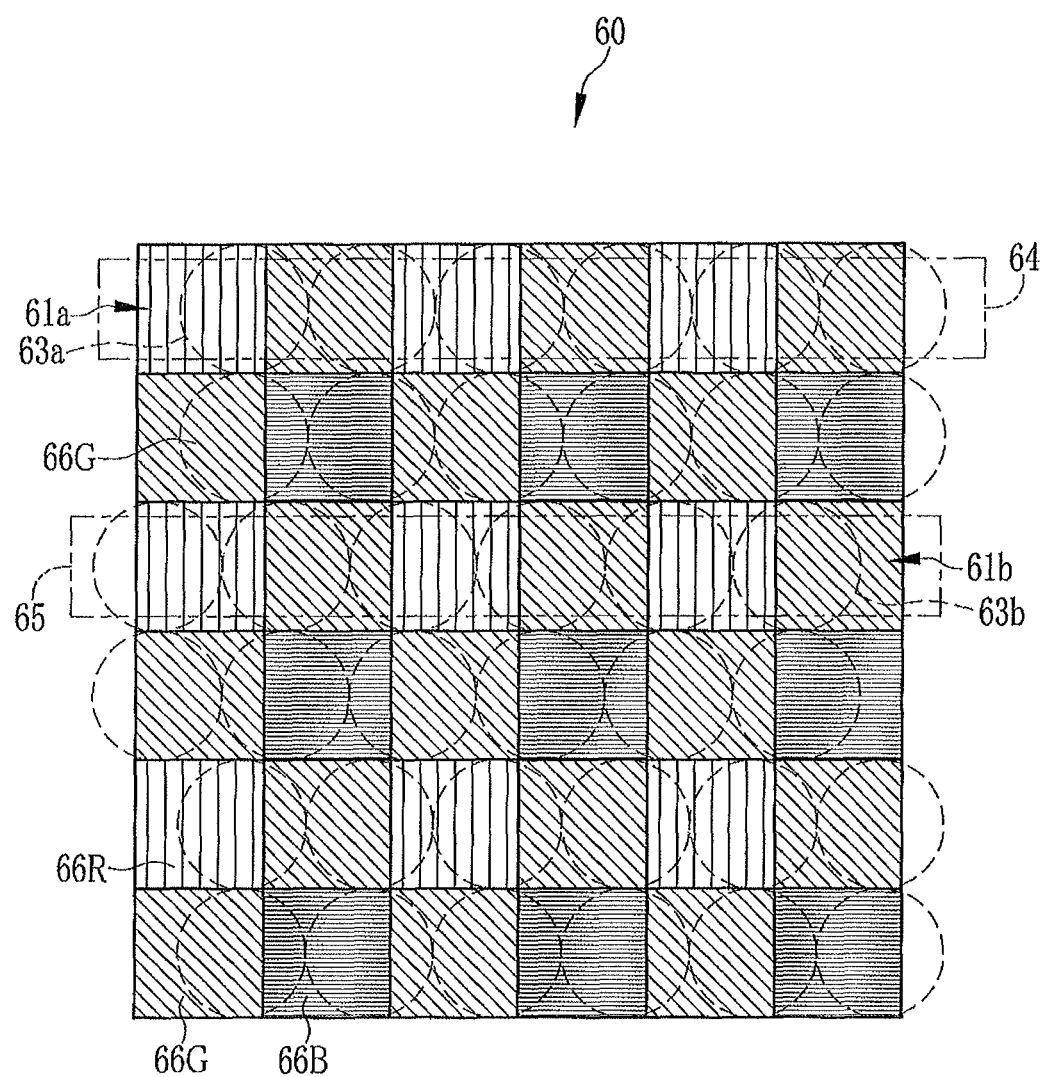
FIG. 11 is an explanatory view illustrating the color filters arranged in such away that all of the microlenses of the four pixels in the Bayer pattern are arranged eccentrically in one direction by way of example.

In the CCD image sensor 50 shown in FIG. 9, disparity is created between the two upper pixels and the two lower pixels of the four pixels in the Bayer pattern. The disparity may adversely affect spectral characteristics. As shown in FIG. 11, in the CCD image sensor 60 having color filters 66R, 66G, and 66B arranged in the Bayer pattern, the microlenses are shifted in the same direction relative to the four pixels constituting the Bayer pattern. This prevents deterioration of the spectral characteristics due to the disparity.

In the above embodiments, a configuration of the pixels close to an optical center is described by way of example. A chief ray incident angle is inclined from the vertical direction as the pixel is away from the optical center. A so-called scaling method that corrects the positional relation between the microlens and the PD is used accordingly. The present invention does not detail a pixel configuration other than that close to the optical center. However, it is obvious that a direction and magnitude of the scaling affect the amount and the direction of the eccentricity of the microlens described above. It is also obvious that the amount and the direction of the eccentricity of the microlens is corrected based on the direction and the magnitude of the scaling.

Figure 12:
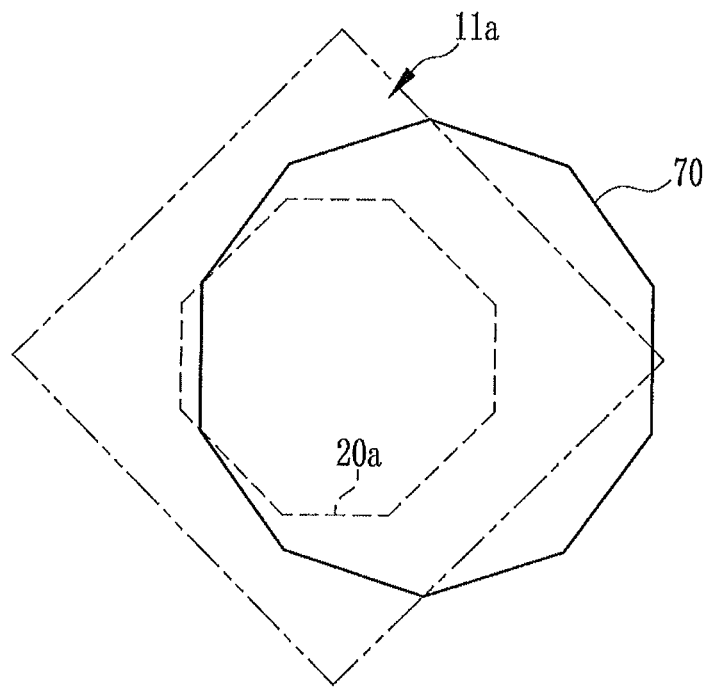
FIG. 12 is an explanatory view illustrating an example in which the microlens is formed into a polyhedral shape.
Figure 13:
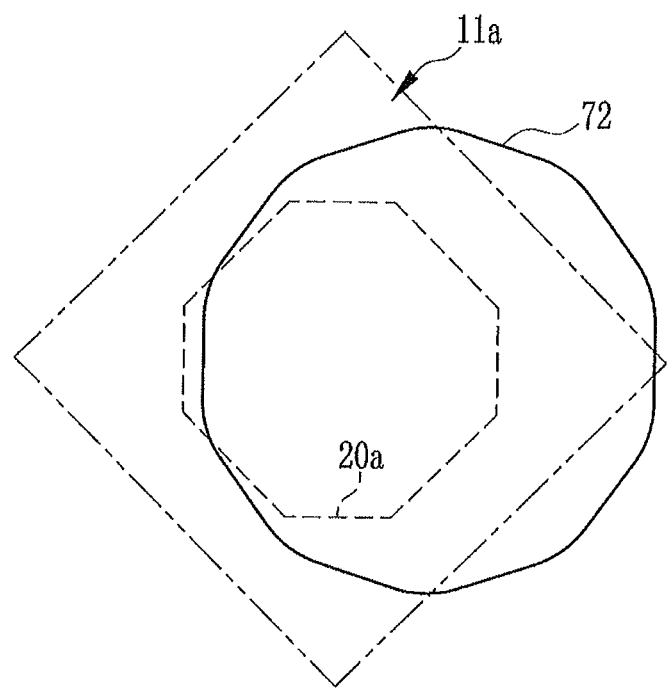
FIG. 13 is an explanatory view illustrating an example in which the microlens is formed into a polyhedral shape with rounded vertices and lines.

In the above embodiments, the microlens with a hemispherical or semi-ellipsoidal shape is used. Alternatively, as shown in FIG. 12, a microlens 70 may have a polyhedral shape. As shown in FIG. 13, a microlens 72 may have a rounded polyhedral shape with chamfered vertices and lines. A microlens may have a shape of an aspheric lens.

The present invention can be applied to another type of solid state imaging device other than the CCD image sensor, for example, a CMOS image sensor.

Various changes and modifications are possible in the present invention and may be understood to be within the present invention.

What is claimed is:

1. A solid state imaging device having a plurality of phase difference detection pixels arranged adjacent to each other, the phase difference detection pixels each comprising:
    a photoelectric converter for photoelectrically converting incident light into charge and accumulating the charge; and
    a microlens provided to the each photoelectric converter, an optical axis of the microlens being eccentric to a center of the photoelectric converter such that a part of the microlens overlaps the adjacent phase difference detection pixel, the microlens condensing the light onto the photoelectric converter,
    wherein the phase difference detection pixels include:
        a first pixel with the microlens arranged eccentrically in a predetermined eccentricity direction;
        a second pixel with the microlens arranged eccentrically opposite to the eccentricity direction;
        a third pixel with the microlens arranged eccentrically in an orthogonal direction substantially orthogonal to the eccentricity direction; and
        a fourth pixel with the microlens arranged eccentrically opposite to the orthogonal direction.

2. The solid state imaging device of claim 1, further including:
    first pixel rows and second pixel rows, the each first pixel row having the first pixels and the second pixels arranged alternately in a predetermined direction, the each second pixel row having the third pixels and the fourth pixels arranged alternately in the same direction as the predetermined direction, wherein the first and second pixel rows are arranged alternately in a direction substantially orthogonal to the first and second pixel rows, and
    the microlens of each of the third and fourth pixels is arranged eccentrically so as to overlap a part of the adjacent first pixel and a part of the adjacent second pixel, and the microlens of each of the first and second pixels is arranged eccentrically so as to overlap a part of the adjacent third pixel and a part of the adjacent fourth pixel.

3. The solid state imaging device of claim 2, wherein the phase difference detection pixels are arranged in horizontal and vertical directions in a honeycomb pattern in which the phase difference detection pixels adjacent in the horizontal direction are shifted from each other by ½ pitch in the vertical direction, and
the pixels in the each pixel row are arranged in an up-down direction of the imaging surface, and
the microlens of the first pixel is arranged eccentrically in a rightward direction of the imaging surface, and
the microlens of the second pixel is arranged eccentrically in a leftward direction of the imaging surface, and
the microlens of the third pixel is arranged eccentrically in an upward direction of the imaging surface, and
the microlens of the fourth pixel is arranged eccentrically in a downward direction of the imaging surface.

4. The solid state imaging device of claim 2, wherein the phase difference detection pixels are arranged in a simple square lattice pattern in horizontal and vertical directions, and
the pixels in the each pixel row are arranged in a 45-degree oblique direction of the imaging surface, and
the microlens of the first pixel is arranged eccentrically in an obliquely lower right direction of the imaging surface, and
the microlens of the second pixel is arranged eccentrically in an obliquely upper left direction of the imaging surface, and
the microlens of the third pixel is arranged eccentrically in an obliquely upper right direction of the imaging surface, and
the microlens of the fourth pixel is arranged eccentrically in an obliquely lower left direction of the imaging surface.

5. The solid state imaging device of claim 2, wherein an amount of eccentricity of the microlens of the phase difference detection pixel is approximately $(4-\sqrt{10})/3$ times a radius of a maximum circle of the phase difference detection pixel, and the maximum circle has a center point, being a center of a light receiving surface of the photoelectric converter.

6. The solid state imaging device of claim 2, further including:
green color filters provided to the first and second pixels such that all of the pixels in the first pixel row are green phase difference detection pixels; and
red color filters and blue color filters provided to the third and fourth pixels such that the first pixel row is disposed between the second pixel row having only red phase difference detection pixels and the second pixel row having only blue phase difference detection pixels.

7. The solid state imaging device of claim 2, further including a charge transfer section for transferring the charge, accumulated in the each photoelectric converter, in a direction substantially parallel with an arrangement direction of the pixels in the each pixel row.

8. The solid state imaging device of claim 1, wherein the microlens has one of a hemispherical shape, a semi-ellipsoidal shape, a polyhedral shape, and a polyhedral shape with rounded vertices and lines.

9. A solid state imaging device having a plurality of phase difference detection pixels arranged adjacent to each other, the phase difference detection pixels each comprising:
a photoelectric converter for photoelectrically converting incident light into charge and accumulating the charge; and
a microlens provided to the each photoelectric converter, an optical axis of the microlens being eccentric to a center of the photoelectric converter such that a part of the microlens overlaps the adjacent phase difference detection pixel, the microlens condensing the light onto the photoelectric converter,
wherein the phase difference detection pixels include first pixels each having the microlens arranged eccentrically in a predetermined eccentricity direction and second pixels each having the microlens arranged eccentrically opposite to the eccentricity direction, and
the solid state imaging device includes first pixel rows each having the first pixels arranged in the eccentricity direction and second pixel rows each having the second pixels arranged in the eccentricity direction, and
the first and second pixel rows are arranged alternately in a direction orthogonal to the eccentricity direction, and
a part of the microlens of the first pixel overlaps a part of the adjacent first pixel, and
a part of the microlens of the second pixel overlaps a part of the adjacent second pixel.

10. The solid state imaging device of claim 9, further including:
four green color filters provided to the four respective pixels arranged next to each other in a direction orthogonal to the pixel rows; and
two adjacent red color filters and two adjacent blue color filters provided to the another four pixels arranged adjacent to and parallel with the four pixels with the green color filters,
wherein the green, red, and blue color filters are arranged in units of the eight color filters over the pixels, and each unit is composed of the four green color filters, the two red color filters, and the two blue color filters.

11. The solid state imaging device of claim 9, further including:
a plurality of third pixels in each of which an optical axis center of the microlens is coincident with a center of a light receiving surface of the photoelectric converter; and
third pixel rows each having the third pixels arranged along the first and second pixel rows, the first to third pixel rows being arranged sequentially and repeatedly.

12. The solid state imaging device of claim 11, further including:
two green color filters provided to the two respective pixels, arranged obliquely, out of the four pixels arranged in a lattice pattern of 2×2; and
a red color filter and a blue color filter provided to the two respective remaining pixels,
wherein the green, red, and blue color filters are arranged into a Bayer pattern.

13. The solid state imaging device of claim 9, wherein the microlens is elongated in a direction substantially orthogonal to the eccentricity direction such that a part of the microlens overlaps the pixel adjacent in the direction substantially orthogonal to the eccentricity direction.

14. The solid state imaging device of claim 9, wherein $\delta$ is approximately D/3, where $\delta$ denotes an amount of eccentricity of the microlens of the phase difference detection pixel and D denotes an arrangement pitch of the phase difference detection pixels in a direction parallel with the eccentricity direction of the microlens.

15. A solid state imaging device having a plurality of phase difference detection pixels arranged adjacent to each other, the phase difference detection pixels each comprising:
- a photoelectric converter for photoelectrically converting incident light into charge and accumulating the charge; and
- a microlens provided to the each photoelectric converter, an optical axis of the microlens being eccentric to a center of the photoelectric converter such that a part of the microlens overlaps the adjacent phase difference detection pixel, the microlens condensing the light onto the photoelectric converter,
- wherein the phase difference detection pixels include first pixels each having the microlens arranged eccentrically in a predetermined eccentricity direction and second pixels each having the microlens arranged eccentrically opposite to the eccentricity direction, and
- the solid state imaging device includes first pixel rows each having the first pixels arranged in the eccentricity direction and the second pixel rows each having the second pixels arranged in the eccentricity direction, and
- the two first pixel rows and the two second pixel rows are arranged in this order repeatedly in a direction substantially orthogonal to the eccentricity direction, and
- a part of the microlens of the first pixel overlaps a part of the adjacent first pixel, and
- a part of the microlens of the second pixel overlaps a part of the adjacent second pixel.

16. The solid state imaging device of claim 15, further including:
- two green color filters provided to the two respective pixels, arranged obliquely, out of the four pixels arranged in a lattice pattern of 2×2; and
- a red color filter and a blue color filter provided to the two respective remaining pixels,
- wherein the green, red, and blue color filters are arranged into a Bayer pattern.

17. A solid state imaging device having a plurality of phase difference detection pixels arranged adjacent to each other, the phase difference detection pixels each comprising:
- a photoelectric converter for photoelectrically converting incident light into charge and accumulating the charge; and
- a microlens provided to the each photoelectric converter, an optical axis of the microlens being eccentric to a center of the photoelectric converter such that a part of the microlens overlaps the adjacent phase difference detection pixel, the microlens condensing the light onto the photoelectric converter,
- wherein a part of the microlens overlaps the adjacent phase difference detection pixel, and the microlens comes in contact with the microlens of the adjacent phase difference detection pixel.

* * * * *